United States Patent
Matsudai et al.

(10) Patent No.: US 10,903,348 B2
(45) Date of Patent: Jan. 26, 2021

(54) SEMICONDUCTOR DEVICE

(71) Applicants: Kabushiki Kaisha Toshiba, Tokyo (JP); Toshiba Electronic Devices & Storage Corporation, Tokyo (JP)

(72) Inventors: Tomoko Matsudai, Tokyo (JP); Yoko Iwakaji, Tokyo (JP); Takeshi Suwa, Kanagawa (JP)

(73) Assignees: Kabushiki Kaisha Toshiba, Tokyo (JP); Toshiba Electronic Devices & Storage Corporation, Tokyo (JP)

( * ) Notice: Subject to any disclaimer, the term of this patent is extended or adjusted under 35 U.S.C. 154(b) by 29 days.

(21) Appl. No.: 16/278,795

(22) Filed: Feb. 19, 2019

(65) Prior Publication Data
US 2020/0091325 A1    Mar. 19, 2020

(30) Foreign Application Priority Data
Sep. 19, 2018  (JP) .................... 2018-174703

(51) Int. Cl.
| | |
|---|---|
| H01L 29/66 | (2006.01) |
| H01L 29/739 | (2006.01) |
| H01L 29/40 | (2006.01) |
| H01L 27/06 | (2006.01) |
| H01L 29/423 | (2006.01) |

(52) U.S. Cl.
CPC ...... *H01L 29/7397* (2013.01); *H01L 27/0635* (2013.01); *H01L 29/401* (2013.01); *H01L 29/4236* (2013.01); *H01L 29/66348* (2013.01)

(58) Field of Classification Search
CPC ............. H01L 29/739; H01L 29/7395; H01L 29/66348; H01L 29/7397
See application file for complete search history.

(56) References Cited

U.S. PATENT DOCUMENTS

| 5,381,026 A | 1/1995 | Shinohe et al. |
| 8,890,252 B2 | 11/2014 | Saikaku et al. |

(Continued)

FOREIGN PATENT DOCUMENTS

| JP | H05-041515 A | 2/1993 |
| JP | 2012-049499 A | 3/2012 |
| JP | 2013-251395 A | 12/2013 |

*Primary Examiner* — Phuc T Dang
(74) *Attorney, Agent, or Firm* — White & Case LLP

(57) ABSTRACT

A semiconductor device includes a semiconductor body including first to fourth semiconductor layers. The second semiconductor layer of second conductivity type is provided on the first semiconductor layer of first conductivity type; the third semiconductor layer of first conductivity type is provided selectively on the second semiconductor layer; and the fourth semiconductor layer of second conductivity type is provided selectively on the second semiconductor layer. The semiconductor device further includes first and second control electrodes. The first and second control electrodes are provided inside the semiconductor body and oppose the second semiconductor layer with first and second insulating films interposed, respectively, and are arranged alternately with a third insulating layer interposed. The first control electrode contacts the third insulating layer at a first surface thereof, and the second control electrode contacts the third insulating layer at a second surface opposite to the first surface.

18 Claims, 15 Drawing Sheets

(56) References Cited

U.S. PATENT DOCUMENTS

| | | | |
|---|---|---|---|
| 2013/0082768 A1* | 4/2013 | Hirler | H01L 29/40 327/580 |
| 2015/0069460 A1* | 3/2015 | Hara | H01L 29/0834 257/139 |
| 2017/0250260 A1 | 8/2017 | Bina et al. | |

* cited by examiner

SEMICONDUCTOR DEVICE

CROSS-REFERENCE TO RELATED APPLICATIONS

This application is based upon and claims the benefit of priority from Japanese Patent Application No. 2018-174703, filed on Sep. 19, 2018; the entire contents of which are incorporated herein by reference.

FIELD

Embodiments relate to a semiconductor device.

BACKGROUND

For example, an insulated gate bipolar transistor (IGBT) is used as a semiconductor device having a breakdown voltage of 600 V or more. Because such a semiconductor device is used in, for example, a power converter, it is desirable to have both a low steady loss and a low switching loss, that is, both a low ON-resistance and a fast switching speed.

For example, to reduce the ON-resistance in an IGBT including a trench gate, a structure is used in which the trench gate extends deeply into an $n^-$-type base layer from the channel region. Thereby, the accumulation amount of the carriers in the $n^-$-type base layer can be increased effectively between the mutually-adjacent trench gates; and the ON-resistance can be reduced. However, realizing a low ON-resistance by increasing the accumulation amount of the carriers causes a longer carrier discharge time at turn-off; and the switching speed is reduced. That is, the decrease of the steady loss and the decrease of the switching loss have a trade-off relationship.

DETAILED DESCRIPTION

Figure 1:
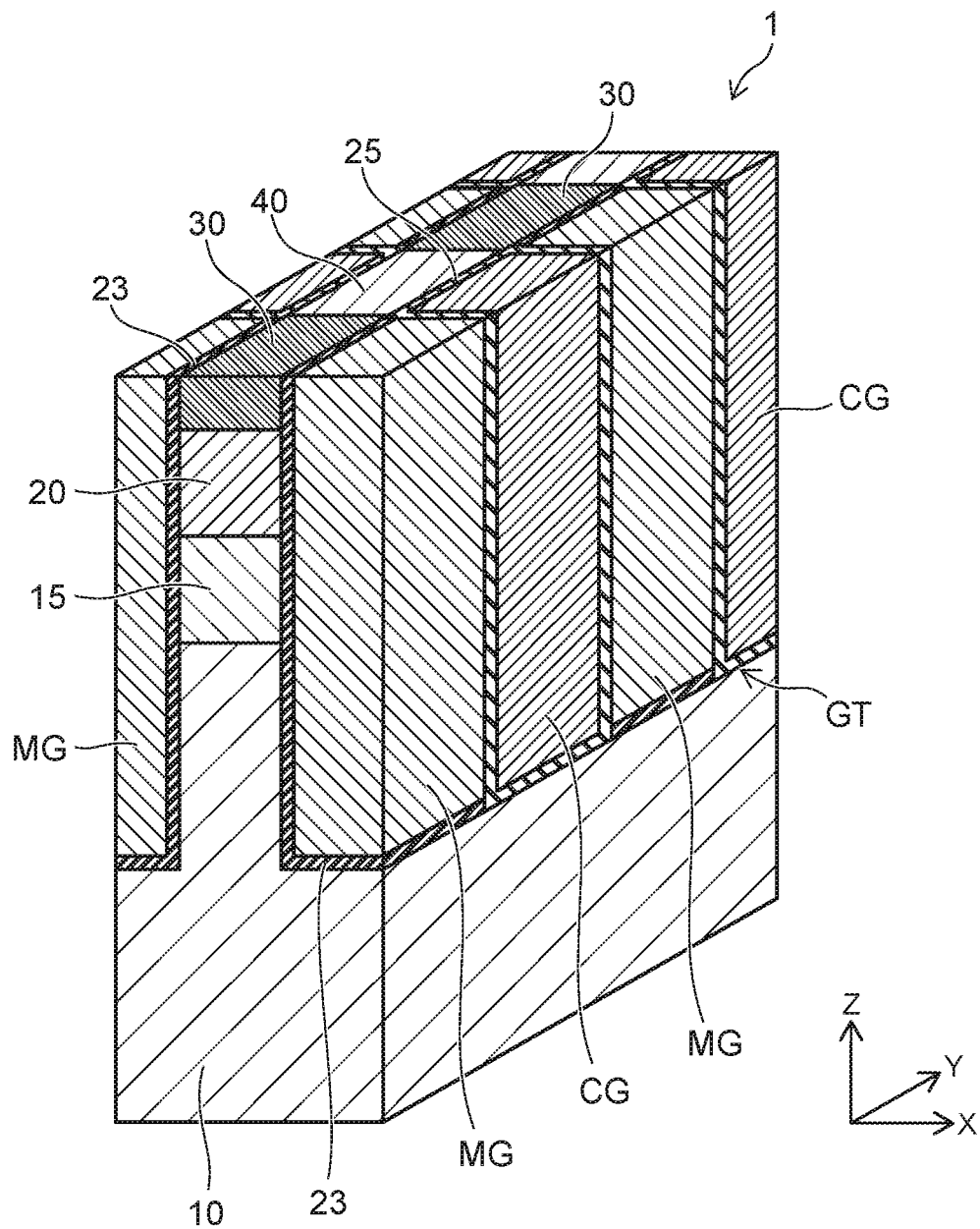
FIG. 1 is a schematic perspective view illustrating a semiconductor device according to an embodiment.

According to one embodiment a semiconductor device includes a semiconductor body including a first semiconductor layer of a first conductivity type, a second semiconductor layer of a second conductivity type, a third semiconductor layer of the first conductivity type, and a fourth semiconductor layer of the second conductivity type; the second semiconductor layer is provided on the first semiconductor layer; the third semiconductor layer is provided selectively on the second semiconductor layer; and the fourth semiconductor layer is provided selectively on the second semiconductor layer and arranged with the third semiconductor layer on the second semiconductor layer. The semiconductor device further includes a first control electrode and a second control electrode; the first control electrode is provided inside the semiconductor body and opposes the second semiconductor layer with a first insulating film interposed; and the second control electrode is provided inside the semiconductor body and opposes the second semiconductor layer with a second insulating film interposed. The first control electrode and the second control electrode are arranged alternately in a first direction crossing a stacking direction of the first semiconductor layer and the second semiconductor layer. A third insulating layer is provided between the first control electrode and the second control electrode, the third insulating layer having a first surface and a second surface opposite to the first surface. The first control electrode contacts the third insulating layer at the first surface, and the second control electrode contacts the third insulating layer at the second surface.

Embodiments will now be described with reference to the drawings. The same portions inside the drawings are marked with the same numerals; a detailed description is omitted as appropriate; and the different portions are described. The drawings are schematic or conceptual; and the relationships between the thicknesses and widths of portions, the proportions of sizes between portions, etc., are not necessarily the same as the actual values thereof. The dimensions and/or the proportions may be illustrated differently between the drawings, even in the case where the same portion is illustrated.

There are cases where the dispositions of the components are described using the directions of XYZ axes shown in the drawings. The X-axis, the Y-axis, and the Z-axis are orthogonal to each other. Hereinbelow, the directions of the X-axis, the Y-axis, and the Z-axis are described as an X-direction, a Y-direction, and a Z-direction. Also, there are cases where the Z-direction is described as upward and the direction opposite to the Z-direction is described as downward.

Moreover, Symbols "$n^+$", "n" and "$n^-$" indicate the n-type semiconductor, and the n-type impurity concentrations thereof are decreased in this order. Symbols "$p^+$", "p" and "$p^-$" indicate the p-type semiconductor, and the p-type impurity concentrations thereof are decreased in this order.

FIG. 1 to FIG. 3E are schematic views illustrating a semiconductor device 1 according to an embodiment. The semiconductor device 1 is, for example, an IGBT.

As shown in FIG. 1, the semiconductor device 1 includes, for example, an $n^-$-type base layer 10 (a first semiconductor layer), an n-type barrier layer 15, a p-type base layer 20 (a second semiconductor layer), an n-type emitter layer 30 (a third semiconductor layer), a $p^+$-type contact layer 40 (a fourth semiconductor layer), a first gate electrode MG, and a second gate electrode CG. The semiconductor device 1 may have a structure in which the n-type barrier layer 15 is not included, that is, a structure in which the p-type base layer 20 is provided directly on the $n^-$-type base layer 10.

The $n^-$-type base layer 10, the n-type barrier layer 15, the p-type base layer 20, the n-type emitter layer 30, and the $p^+$-type contact layer 40 are, for example, silicon layers but are not limited thereto.

The n-type barrier layer 15 is provided on the $n^-$-type base layer 10. The p-type base layer 20 is provided on the n-type barrier layer 15. For example, the n-type emitter layer 30 and the $p^+$-type contact layer 40 are arranged in the Y-direction on the p-type base layer 20.

For example, the first gate electrode MG and the second gate electrode CG are provided in the interior of a gate trench GT having a depth reaching the n⁻-type base layer 10 from the level of the upper surface of the n-type emitter layer 30. The gate trench GT extends in a direction, e.g., the Y-direction, along the boundary of the n-type barrier layer 15 and the p-type base layer 20.

For example, the first gate electrode MG and the second gate electrode CG are arranged alternately in the Y-direction inside the gate trench GT. For example, the first gate electrode MG is disposed at a position opposing the n⁻-type base layer 10, the n-type barrier layer 15, the p-type base layer 20, and the n-type emitter layer 30 with a gate insulating film 23 interposed. For example, the second gate electrode CG is disposed at a position opposing the n⁻-type base layer 10, the n-type barrier layer 15, the p-type base layer 20, and the p⁺-type contact layer 40 with a gate insulating film 25 interposed.

Figure 2:
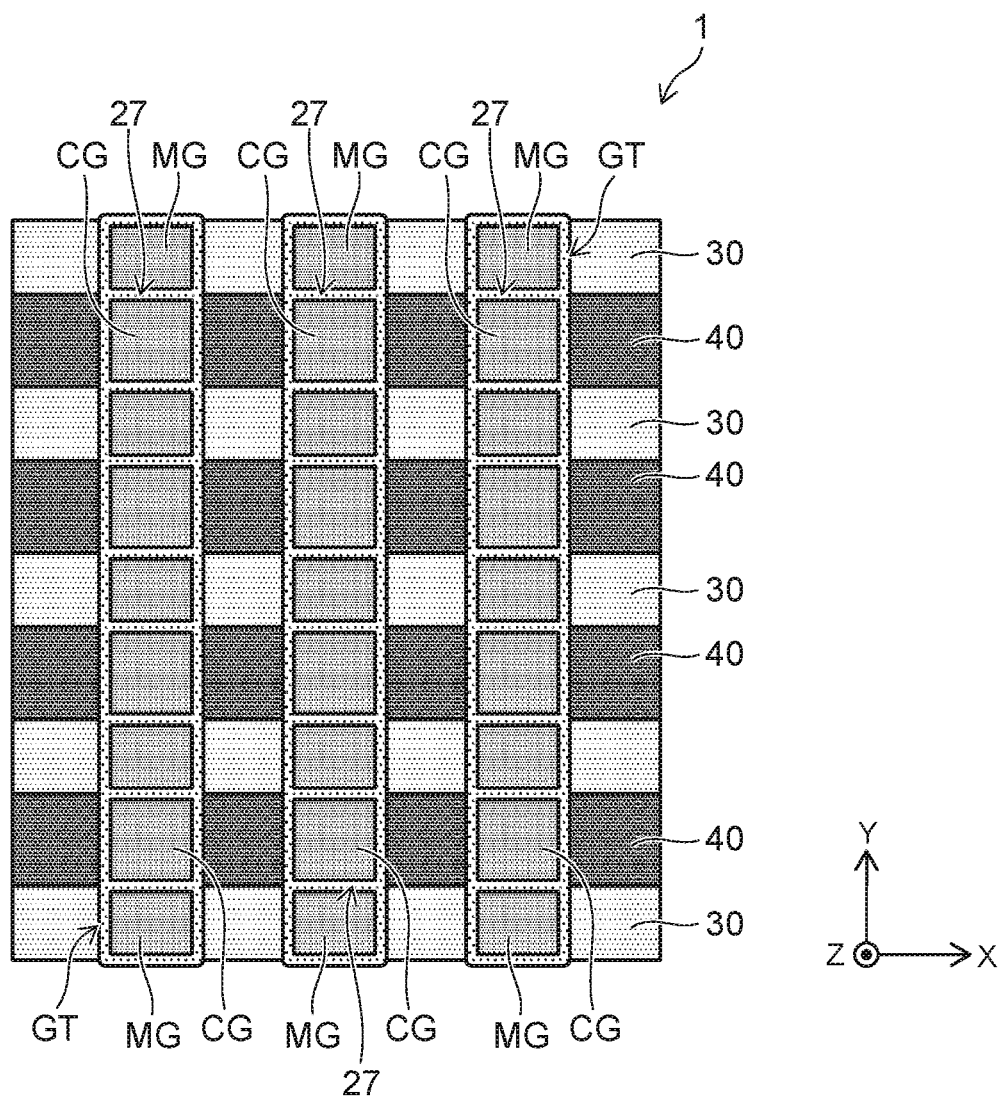
FIG. 2 is a schematic plan view illustrating the semiconductor device according to the embodiment.

FIG. 2 is a plan view showing an arrangement of the n-type emitter layer 30, the p⁺-type contact layer 40, the first gate electrode MG, and the second gate electrode CG. The gate trenches GT that include the first gate electrode MG and the second gate electrode CG extend in the Y-direction and are arranged in the X-direction. The n-type emitter layer 30 and the p⁺-type contact layer 40 are provided between the mutually-adjacent gate trenches GT and are arranged alternately in, for example, the Y-direction. The first gate electrodes MG are disposed on two sides of the n-type emitter layer 30; and the second gate electrodes CG are disposed on two sides of the p⁺-type contact layer 40. The first gate electrode MG and the second gate electrode CG are arranged alternately in the Y-direction with an insulating film 27 interposed.

The n-type emitter layer 30 and the p⁺-type contact layer 40 are arranged alternately in the longitudinal direction of the gate trench GT. The widths in the longitudinal direction (the Y-direction) of the n-type emitter layer 30 and the p⁺-type contact layer 40 are set to obtain the desired characteristics. In other words, the ratio of the surface areas of the n-type emitter layer 30 and the p⁺-type contact layer 40 contacting an emitter electrode 60 can be set to obtain the desired characteristics.

The first gate electrode MG and the second gate electrode CG have lengths in the Y-direction corresponding respectively to the length in the Y-direction of the n-type emitter layer 30 and the length in the Y-direction of the p⁺-type contact layer 40. The first gate electrode MG and the second gate electrode CG are disposed adjacent to each other with the insulating film 27 interposed.

FIGS. 3A to 3E are schematic views showing the semiconductor device 1.

Figure 3A:
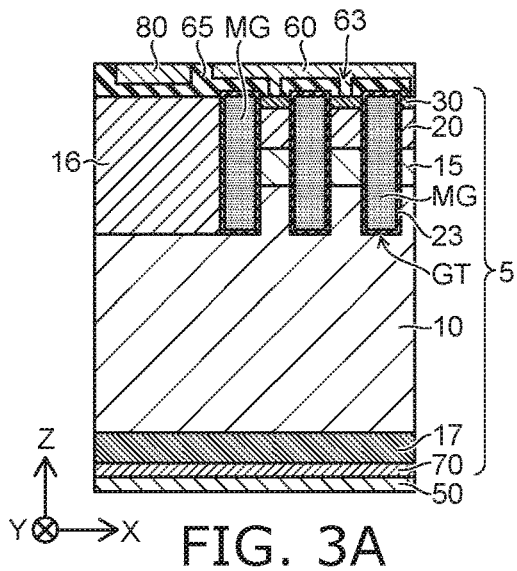
FIGS. 3A to 3E are schematic views illustrating the semiconductor device according to the embodiment.
Figure 3B:
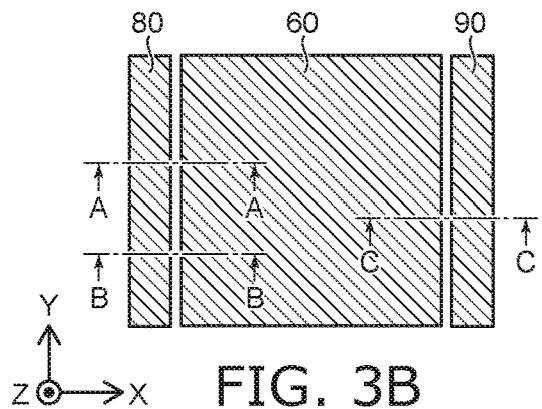

FIG. 3A is a schematic view showing a cross section along line A-A shown in FIG. 3B.

FIG. 3B is a schematic plan view showing the upper surface of the semiconductor device 1.

Figure 3C:
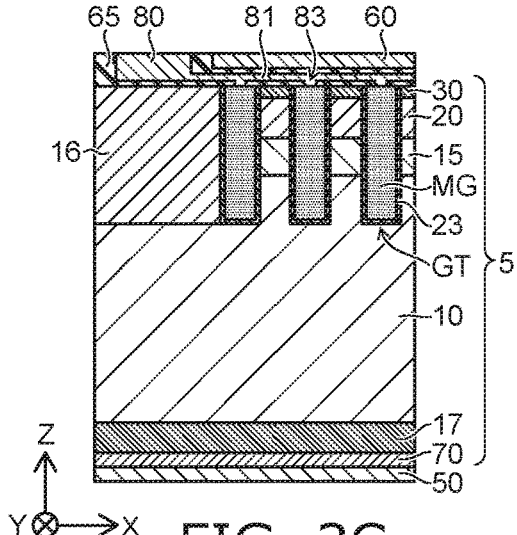

FIG. 3C is a cross-sectional view along line B-B shown in FIG. 3B and illustrates a cross section of the first gate electrodes MG.

Figure 3D:
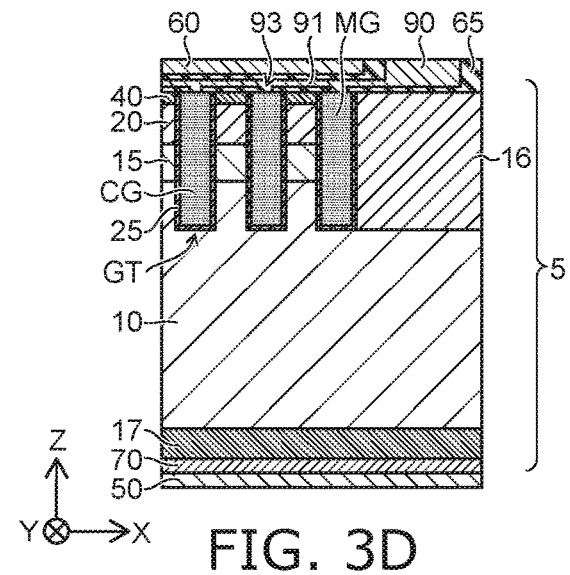

FIG. 3D is a cross-sectional view along line C-C shown in FIG. 3B and illustrates a cross section of the second gate electrodes CG.

Figure 3E:
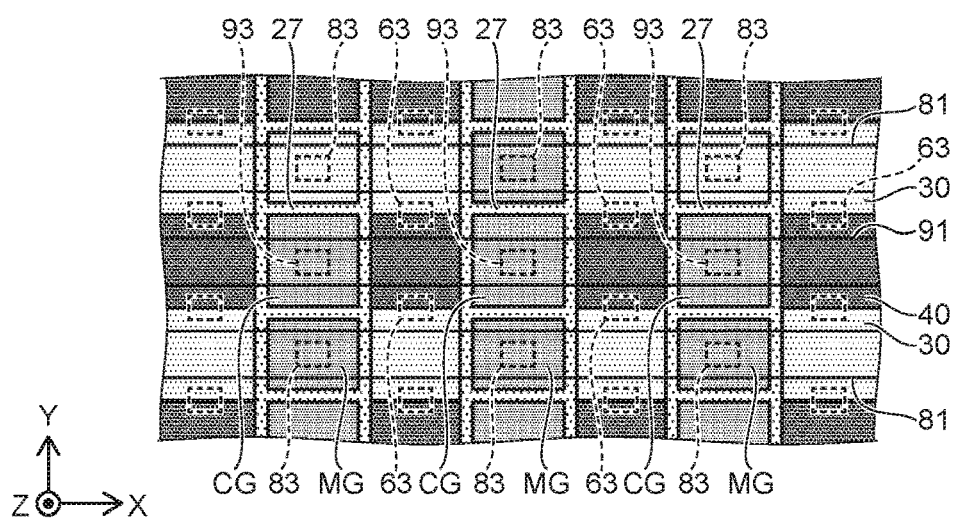

FIG. 3E is a schematic plan view illustrating gate interconnects.

As shown in FIG. 3A, FIG. 3C, and FIG. 3D, the semiconductor device 1 further includes a collector electrode 50, the emitter electrode 60, and a p-type collector layer 70. The collector electrode 50 and the emitter electrode 60 are, for example, metal layers including at least one selected from aluminum (Al), titanium (Ti), nickel (Ni), tungsten (W), and gold (Au). The collector electrode 50 and the emitter electrode 60 are electrically connected to a semiconductor body 5.

The semiconductor body 5 includes the n⁻-type base layer 10, the n-type barrier layer 15, the p-type base layer 20, the n-type emitter layer 30, the p⁺-type contact layer 40, and the p-type collector layer 70 and is disposed between the collector electrode 50 and the emitter electrode 60. The p-type collector layer 70 is provided between the collector electrode 50 and the n⁻-type base layer 10. For example, the p-type collector layer 70 includes a p-type impurity of $1 \times 10^{13}$ to $1 \times 10^{15}$ cm⁻². The layer thickness of the p-type collector layer 70 is, for example, 0.1 to 10 μm.

The n⁻-type base layer 10 is provided between the emitter electrode 60 and the p-type collector layer 70. The n-type impurity concentration of the n⁻-type base layer 10 is, for example, $1 \times 10^{12}$ to $1 \times 10^{15}$ cm⁻³. The layer thickness of the n⁻-type base layer is, for example, 10 to 1000 μm. The impurity concentration and the layer thickness of the n⁻-type base layer 10 are set according to the breakdown voltage when the reverse bias is applied.

A structure may be used in which an n-type buffer layer 17 is disposed between the n⁻-type base layer 10 and the p-type collector layer 70. For example, the n-type buffer layer 17 includes the n-type impurity having a higher concentration than the n-type impurity of the n⁻-type base layer 10. For example, the n-type buffer layer 17 is provided to have a layer thickness that is thicker than the layer thickness of the p-type collector layer 70.

The n-type barrier layer 15 includes the n-type impurity having a higher concentration than the n-type impurity of the n⁻-type base layer 10. The n-type impurity amount that is included in the n-type barrier layer 15 is, for example, $1 \times 10^{12}$ to $1 \times 10^{14}$ cm⁻². The layer thickness of the n-type barrier layer 15 is, for example, 0.1 to several μm.

The p-type base layer 20 is provided between the emitter electrode 60 and the n⁻-type base layer 10. The p-type impurity amount of the p-type base layer 20 is, for example, $1 \times 10^{12}$ to $1 \times 10^{14}$ cm⁻². The layer thickness of the p-type base layer 20 is, for example, 1 to several μm. The p-type base layer 20 is electrically connected to the emitter electrode 60 via the p⁺-type contact layer 40.

The gate trenches GT extend in a direction along the boundary between the n-type barrier layer 15 and the p-type base layer 20. For example, the gate trenches GT are arranged periodically in a direction (the X-direction) crossing the longitudinal direction (the Y-direction) of the gate trenches GT. The depth of the gate trench GT is, for example, 1 to 10 μm. The arrangement period of the gate trenches GT is, for example, 0.1 to several μm.

The n⁻-type base layer 10, the n-type barrier layer 15, the p-type base layer 20, the n-type emitter layer 30, and the p⁺-type contact layer 40 are exposed at the inner wall of the gate trench GT. For example, the first gate electrode MG opposes the n⁻-type base layer 10, the n-type barrier layer 15, the p-type base layer 20, and the n-type emitter layer 30 with the gate insulating film 23 interposed. For example, the second gate electrode CG opposes the n⁻-type base layer 10, the n-type barrier layer 15, the p-type base layer 20, and the p⁺-type contact layer 40 with the gate insulating film 25 interposed.

For example, the materials of the first gate electrode MG and the second gate electrode CG are polysilicon including an n-type impurity or a p-type impurity but are not limited thereto. The first gate electrode MG and the second gate electrode CG may include different materials. The gate insulating films 23 and 25 and the insulating film 27 are, for example, silicon oxide films ($SiO_2$). The gate insulating films 23 and 25 and the insulating film 27 are not limited thereto. Also, the insulating films may be formed using different materials.

As shown in FIG. 3A, the semiconductor body 5 further includes a p-type diffusion layer 16. The p-type diffusion layer 16 is provided on the $n^-$-type base layer 10. For example, the boundary between the $n^-$-type base layer 10 and the p-type diffusion layer 16 is positioned at the same level as the bottom surface of the gate trench GT.

The emitter electrode 60 and a gate pad 80 are provided above the semiconductor body 5. An inter-layer insulating film 65 is provided between the semiconductor body 5 and the emitter electrode 60 and between the semiconductor body 5 and the gate pad 80. The p-type diffusion layer 16 is positioned between the $n^-$-type base layer 10 and the gate pad 80.

The n-type emitter layer 30 is provided selectively on the p-type base layer 20 between the mutually-adjacent first gate electrodes MG. The emitter electrode 60 is electrically connected to the n-type emitter layer 30 via a contact hole 63 provided in the inter-layer insulating film 65. The n-type emitter layer 30 includes the n-type impurity having a higher concentration than the n-type impurity of the $n^-$-type base layer 10. The n-type impurity amount of the n-type emitter layer 30 is, for example, $1 \times 10^{14}$ to $1 \times 10^{16}$ $cm^{-2}$. The layer thickness of the n-type emitter layer 30 is 0.1 to several μm.

As shown in FIG. 3B, the emitter electrode 60, the gate pad 80, and a gate pad 90 are disposed at the upper surface of the semiconductor device 1. The gate pad 80 is electrically connected to the first gate electrode MG; and the gate pad 90 is electrically connected to the second gate electrode CG. The gate pad 90 is provided above the p-type diffusion layer 16 (referring to FIG. 3D).

As shown in FIG. 3C, the semiconductor device 1 includes a gate interconnect 81 positioned between the emitter electrode 60 and the first gate electrode MG. The gate interconnect 81 is electrically insulated from the emitter electrode 60 and the semiconductor body 5 by the inter-layer insulating film 65. The gate interconnect 81 is electrically connected to the first gate electrode MG via a contact hole 83. Also, the gate interconnect 81 is electrically connected to the gate pad 80. In other words, the gate pad 80 is electrically connected to the first gate electrode MG via the gate interconnect 81.

As shown in FIG. 3D, the $p^+$-type contact layer 40 is provided selectively on the p-type base layer 20 between the mutually-adjacent second gate electrodes CG. The $p^+$-type contact layer 40 is connected to the emitter electrode 60. The $p^+$-type contact layer 40 includes the p-type impurity having a higher concentration than the p-type impurity of the p-type base layer 20. The p-type impurity amount of the $p^+$-type contact layer 40 is, for example, $1 \times 10^{14}$ to $1 \times 10^{16}$ $cm^{-2}$. The layer thickness of the $p^+$-type contact layer 40 is, for example, 0.1 to several μm.

As shown in FIG. 3D, the semiconductor device 1 also includes a gate interconnect 91 positioned between the emitter electrode 60 and the second gate electrode CG. The gate interconnect 91 is electrically insulated from the emitter electrode 60 and the semiconductor body 5 by the inter-layer insulating film 65. The gate interconnect 91 is electrically connected to the second gate electrode CG via a contact hole 93. Also, the gate interconnect 91 is electrically connected to the gate pad 90. In other words, the gate pad 90 is electrically connected to the second gate electrode CG via the gate interconnect 91.

As shown in FIG. 3E, the gate interconnect 81 extends in, for example, the X-direction on the n-type emitter layer 30 and the first gate electrode MG. For example, the contact hole 83 is provided directly under the gate interconnect 81. On the other hand, the gate interconnect 91 extends in, for example, the X-direction on the $p^+$-type contact layer 40 and the second gate electrode CG. The contact hole 93 is provided directly under the gate interconnect 91.

The contact hole 63 is provided between the gate interconnect 81 and the gate interconnect 91. For example, the contact hole 63 is provided to communicate with both the n-type emitter layer 30 and the $p^+$-type contact layer 40. Thereby, the emitter electrode 60 is electrically connected to both the n-type emitter layer 30 and the $p^+$-type contact layer 40.

Figure 4:
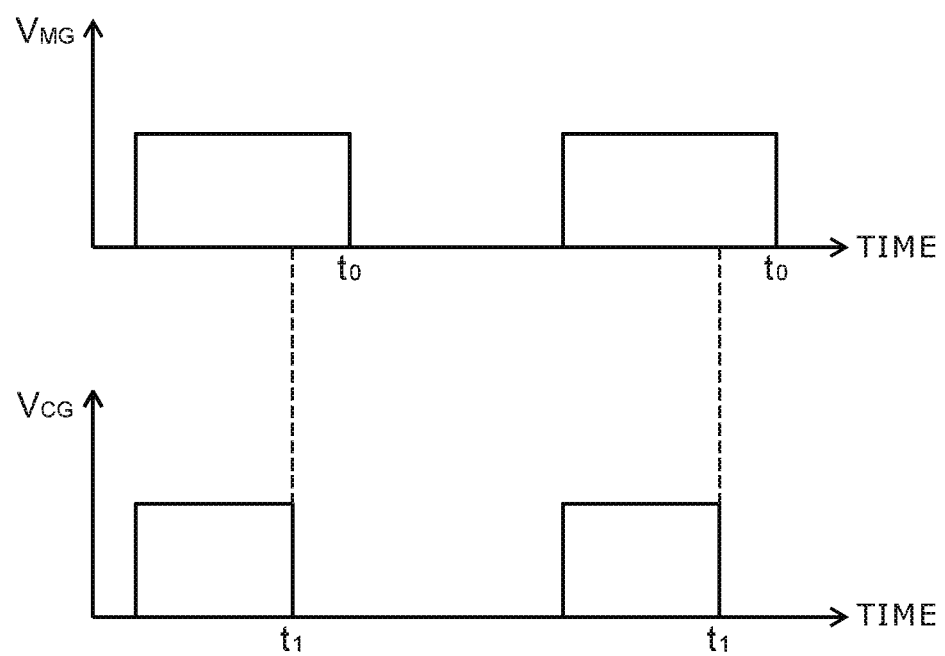
FIG. 4 is a schematic view illustrating an operation of the semiconductor device according to the embodiment.

Operations of the semiconductor device 1 according to the embodiment will now be described with reference to FIGS. 3A to 3D and FIG. 4. FIG. 4 is a time chart schematically showing gate voltages $V_{MG}$ and $V_{CG}$ supplied to the first gate electrode MG and the second gate electrode CG.

For example, when the semiconductor device 1 is turned on, positive drive signals (the gate voltages $V_{MG}$ and $V_{CG}$) are applied to the first gate electrode MG and the second gate electrode CG via the gate interconnects 81 and 91. Thereby, an n-type channel layer (an inversion layer) is formed at the interface vicinity between the p-type base layer 20 and the gate insulating film 23 exposed at the inner wall of the gate trench GT; conduction occurs between the n-type emitter layer 30 and the n-type barrier layer 15/$n^-$-type base layer 10; and electrons are injected into the $n^-$-type base layer 10. Therefore, the state is set to the ON-state in which the p-type collector layer 70 has a forward bias with respect to the $n^-$-type base layer 10 and holes are injected into the $n^-$-type base layer 10 from the p-type collector layer 70. At this time, the holes that are injected travel through the $n^-$-type base layer 10 and flow into the p-type base layer 20.

Further, n-type accumulation layers are formed at the interface vicinity between the $n^-$-type base layer 10 and the gate insulating film 25 and the interface vicinity between the $n^-$-type base layer 10 and the gate insulating film 23 exposed at the inner surface of the gate trench GT. Hole injection from the p-type collector layer 70 into the $n^-$-type base layer 10 is promoted to balance the negative charge of the n-type accumulation layers; and the carrier amount inside the $n^-$-type base layer increases. As a result, the ON-resistance in the turned-on state of the semiconductor device 1 is reduced.

Then, when the semiconductor device 1 is turned off, the gate voltages $V_{MG}$ and $V_{CG}$ that are applied to the first gate electrode MG and the second gate electrode CG are lowered to be a threshold or less. At this time as shown in FIG. 4, the gate voltage $V_{MG}$ of the first gate electrode MG is lowered to be the threshold or less after lowering the gate voltage $V_{CG}$ of the second gate electrode CG to be the threshold or less. By lowering the gate voltage $V_{CG}$ of the second gate electrode CG to be the threshold or less, the n-type accumulation layer at the interface vicinity of the $n^-$-type base layer 10 and the gate insulating film 25 disappears. Thereby, the hole injection amount from the p-type collector layer 70 into the $n^-$-type base layer 10 can be reduced. Continuing, the gate voltage $V_{MG}$ of the first gate electrode MG is lowered to be the threshold or less. Thereby, the n-type channel layer at the interface vicinity of the p-type base layer 20 and the gate insulating film 23 disappears; and injection of the electrons from the n-type emitter layer 30 is stopped. As a result, the semiconductor device 1 is turned off.

In the semiconductor device 1 as shown in FIG. 4, the gate voltage $V_{CG}$ of the second gate electrode CG is lowered to be the threshold or less at a time $t_1$ before a timing $t_0$ of lowering the gate voltage $V_{MG}$ of the first gate electrode MG to be the threshold or less. Thereby, the carrier amount inside the n⁻-type base layer 10 can be reduced between the times $t_1$ and $t_0$. In other words, the gate voltage $V_{MG}$ of the first gate electrode MG is lowered to be the threshold or less after reducing the carrier concentration in the n⁻-type base layer 10 from the steady state (the ON-state). Thereby, the discharge time of the carriers from the n⁻-type base layer 10 can be shortened; and the turn-off speed can be increased. For example, the turn-off time can be shortened compared to the case where the gate voltages $V_{MG}$ and $V_{CG}$ of the first gate electrode MG and the second gate electrode CG are lowered simultaneously to be the threshold or less (the broken lines in FIG. 4).

Further, a negative potential can be supplied to the second gate electrode CG at turn-off of the semiconductor device 1. Thereby, a p-type inversion layer occurs at the interface vicinity between the n⁻-type base layer 10 and the gate insulating film 25; and the discharge of the holes from the n⁻-type base layer 10 into the emitter electrode 60 via the p-type base layer 20 and the p⁺-type contact layer 40 can be promoted. Therefore, it is possible to further reduce the carrier amount inside the n⁻-type base layer 10; and the turn-off speed can be accelerated.

Thus, in the embodiment, the turn-off speed can be increased by arranging the first gate electrode MG and the second gate electrode CG to be adjacent alternately in the longitudinal direction of the gate trench and by controlling the timing of the ramp-down for the gate voltages $V_{MG}$ and $V_{CG}$ supplied to the first gate electrode MG and the second gate electrode CG. Also, even in the case where the widths in the longitudinal direction of the n-type emitter layer 30 and the p⁺-type contact layer 40 are changed according to the desired characteristics, it is possible to change the widths in the longitudinal direction of the first gate electrode MG and the second gate electrode CG to correspond to these widths; and the carrier amount inside the n⁻-type base layer at turn-off can be controlled appropriately. Thereby, for example, it is possible to increase the turn-off speed while maintaining the ON-resistance without changing the device size.

A method for manufacturing the semiconductor device 1 will now be described with reference to FIGS. 5A to 13B. FIG. 5A to 13B are schematic views showing the manufacturing processes of the semiconductor device 1 in order. In each drawing, FIG. A is a plan view schematically showing the front surface of a semiconductor substrate SS; and FIG. B is a schematic view showing a cross section of the semiconductor substrate SS.

Figure 5A:
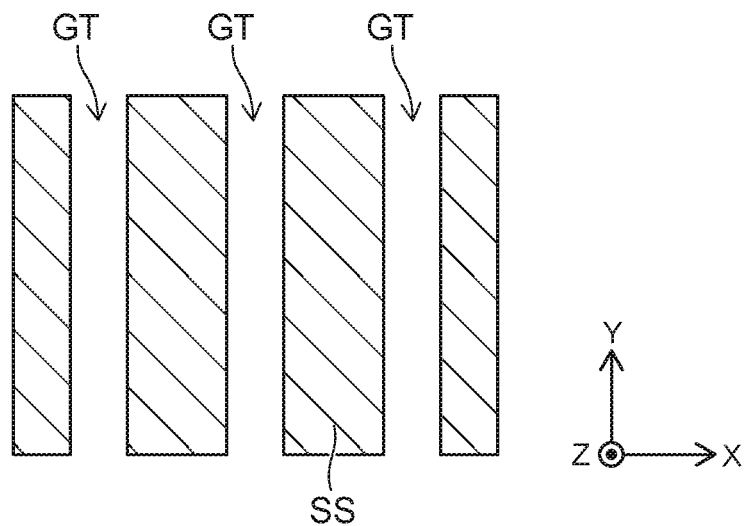
FIG. 5A to FIG. 13B are schematic views illustrating manufacturing processes of the semiconductor device according to the embodiment.
Figure 5B:
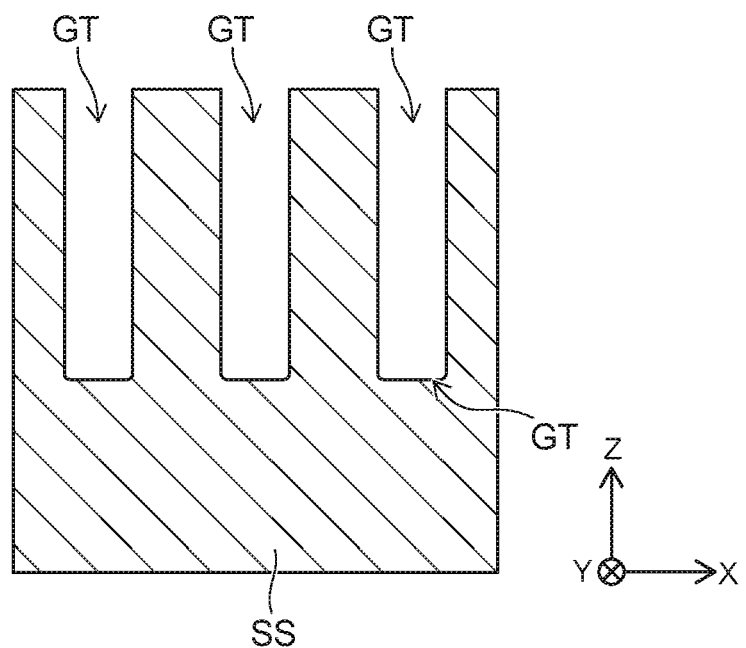

As shown in FIGS. 5A and 5B, the gate trenches GT are formed in the front surface of the semiconductor substrate SS. The semiconductor substrate SS is, for example, an n-type silicon substrate and includes the n-type impurity having the same concentration as the n⁻-type base layer 10. The gate trenches GT extend in the Y-direction along the front surface of the semiconductor substrate SS and are formed to be arranged in the X-direction. The gate trenches GT may be formed to be arranged at a constant period in the X-direction.

Figure 6A:
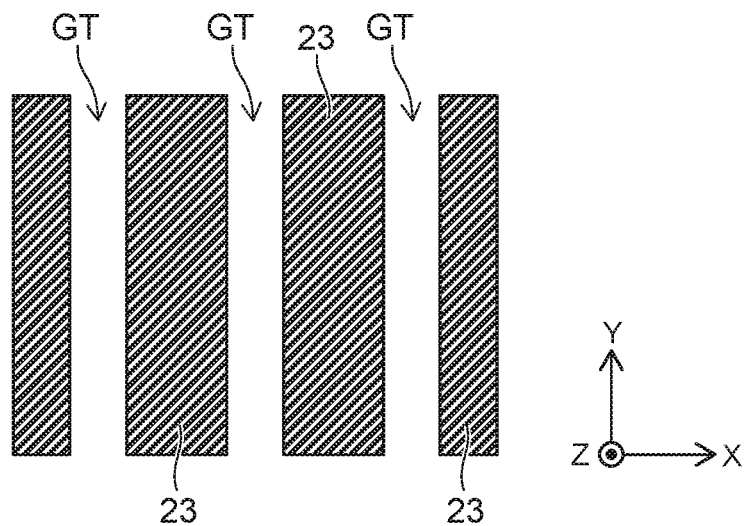
Figure 6B:
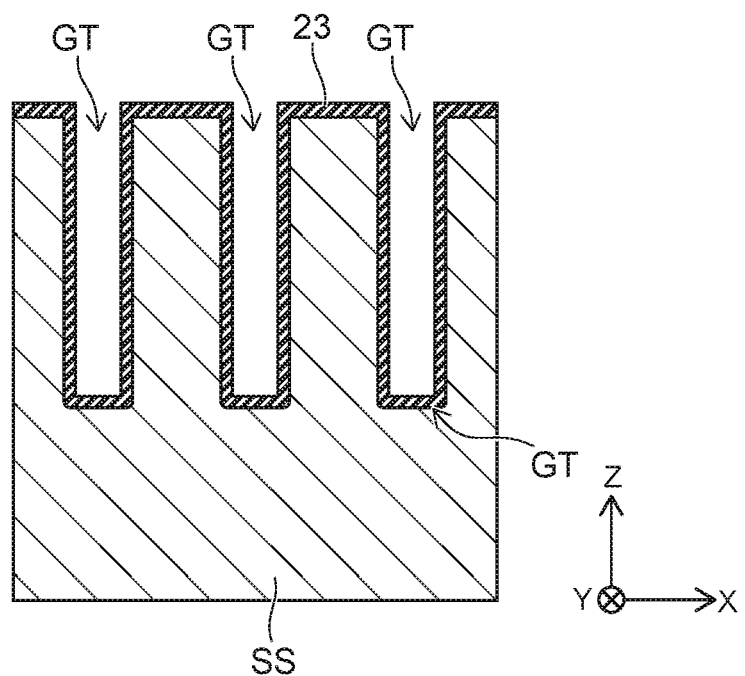

As shown in FIGS. 6A and 6B, the gate insulating film 23 is formed on the front surface of the semiconductor substrate SS and on the inner surfaces of the gate trenches GT. The gate insulating film 23 is, for example, a silicon oxide film and may be formed by thermal oxidation of the semiconductor substrate SS, may be a silicon oxide film formed using CVD (Chemical Vapor Deposition), or may include both a thermal oxide film and a CVD film.

Figure 7A:
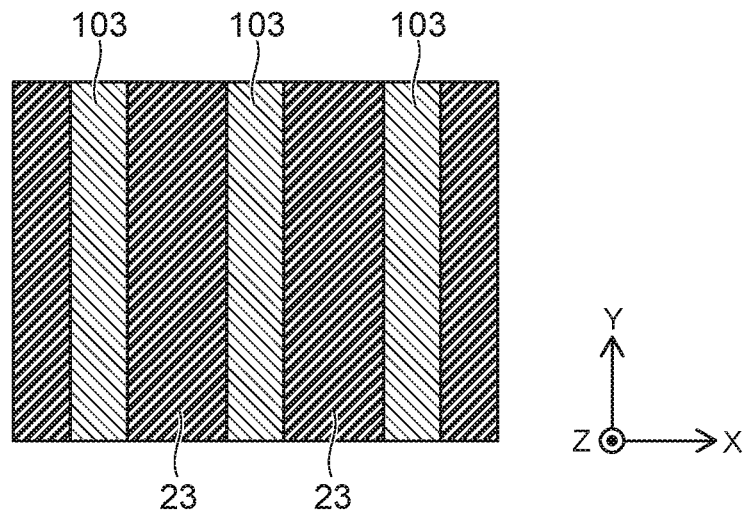
Figure 7B:
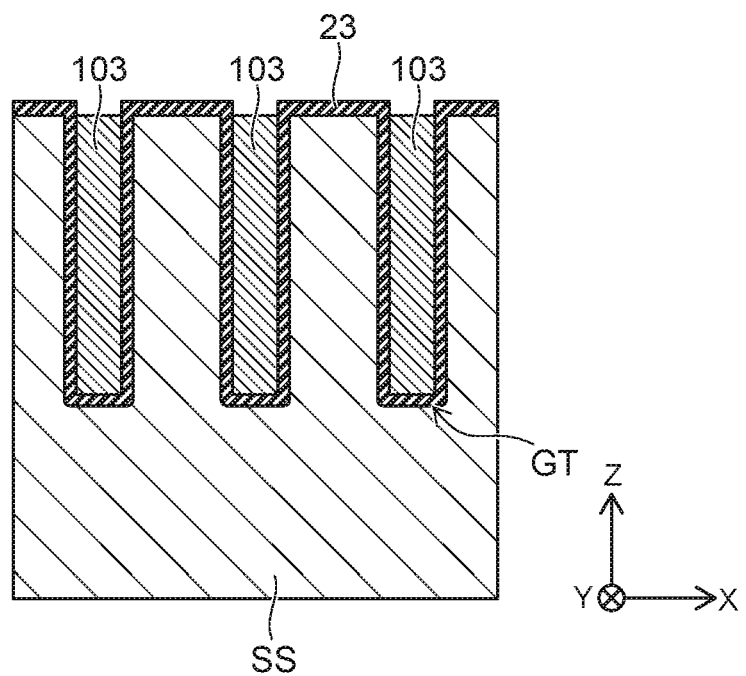

As shown in FIGS. 7A and 7B, a conductive layer 103 is formed in the interiors of the gate trenches GT. The conductive layer 103 is, for example, a conductive polysilicon layer including a p-type or n-type impurity. For example, the conductive layer 103 is formed by forming a polysilicon layer covering the upper surface of the semiconductor substrate SS and filling the interiors of the gate trenches GT, and by subsequently performing etch-back of the polysilicon layer to cause the portion filled into the interiors of the gate trenches GT to remain.

Figure 8A:
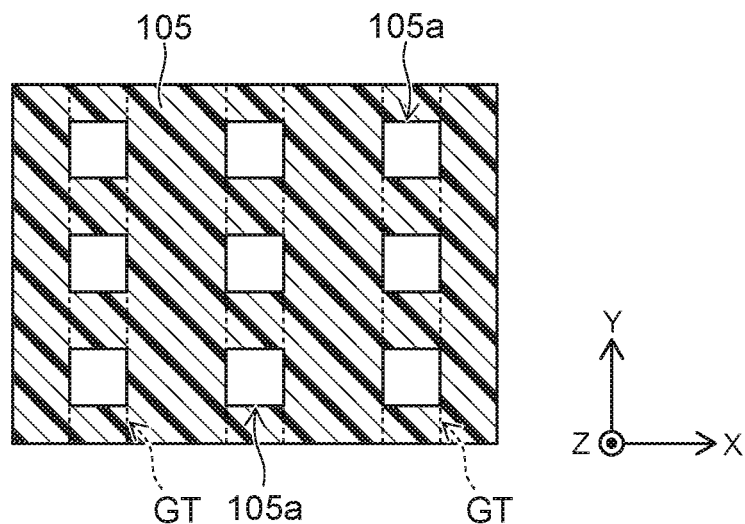
Figure 8B:
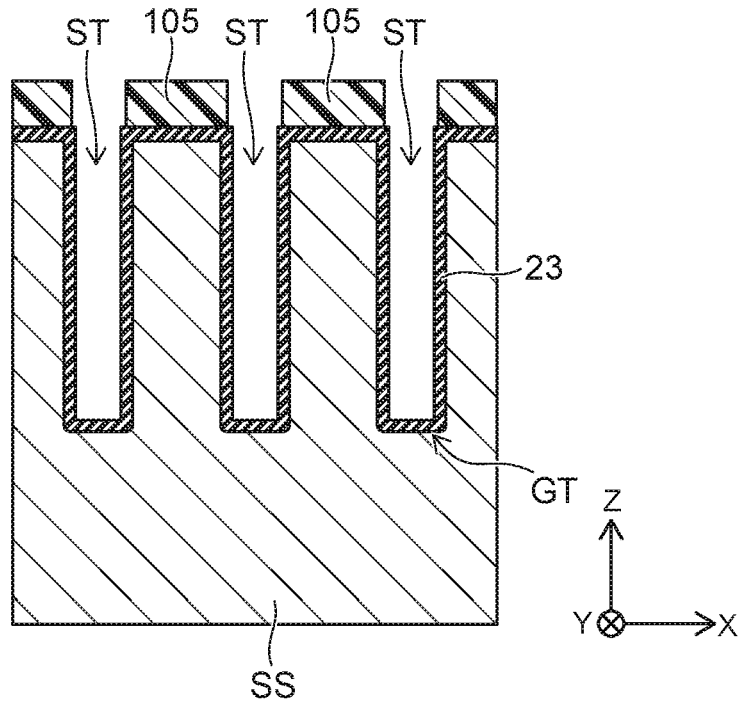

As shown in FIGS. 8A and 8B, sub-trenches ST are formed by selectively removing the conductive layer 103 using an etching mask 105. For example, the etching mask 105 has openings 105a arranged in the Y-direction along the gate trenches GT. After selectively removing the conductive layer 103, the gate insulating film 23 and the conductive layer 103 are exposed at the inner surfaces of the sub-trenches ST.

Figure 9A:
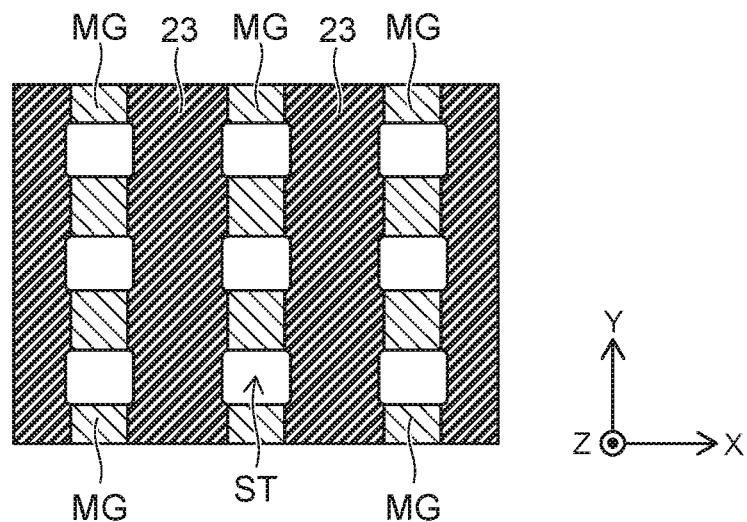
Figure 9B:
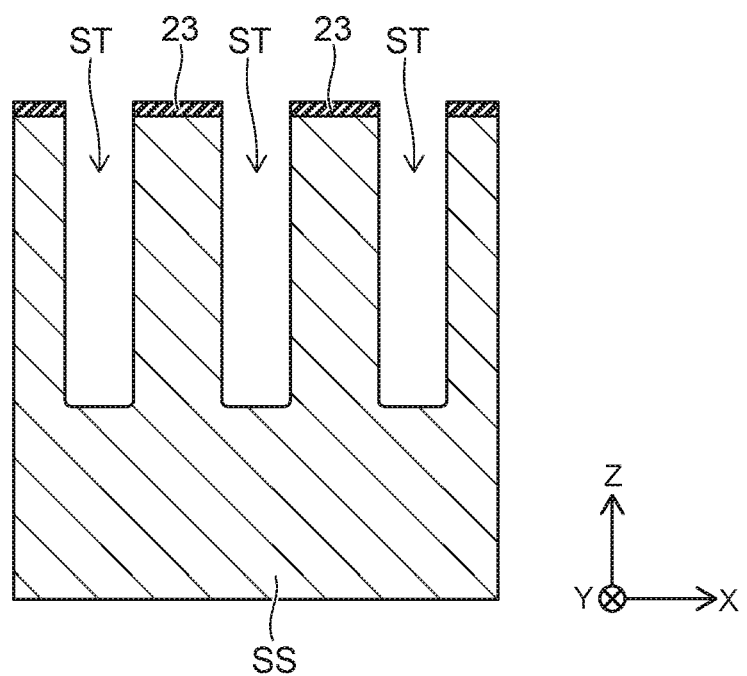

As shown in FIGS. 9A and 9B, the etching mask 105 is removed after selectively removing the gate insulating film 23 exposed at the inner surfaces of the sub-trenches ST. A portion of the conductive layer 103 remains in the interiors of the gate trenches GT as the first gate electrodes MG. The side surfaces of the first gate electrodes MG and the semiconductor substrate SS are exposed at the inner surfaces of the sub-trenches ST.

Figure 10A:
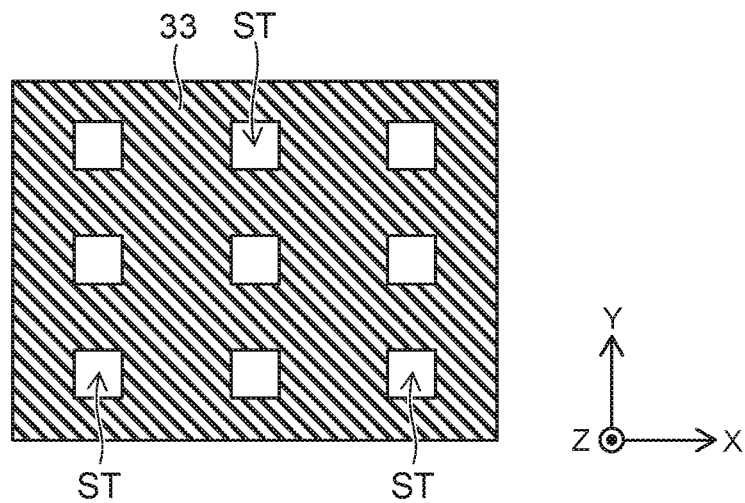
Figure 10B:
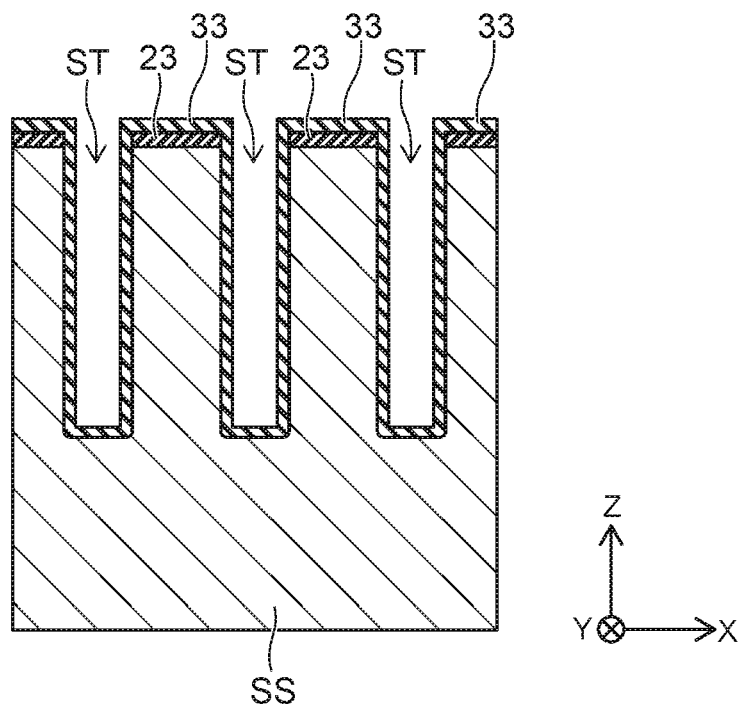

As shown in FIGS. 10A and 10B, an insulating film 33 is formed to cover the inner surfaces of the sub-trenches ST. For example, the insulating film 33 is formed to cover the upper surfaces of the first gate electrodes MG and the gate insulating film 23 formed on the upper surface of the semiconductor substrate SS. For example, the insulating film 33 may be formed by performing thermal oxidation, may be a silicon oxide film formed using CVD (Chemical Vapor Deposition), or may include both a thermal oxide film and a CVD film.

Figure 11A:
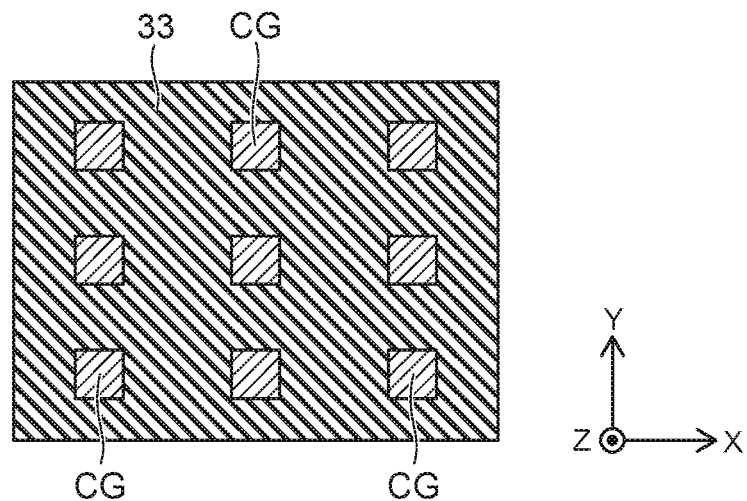
Figure 11B:
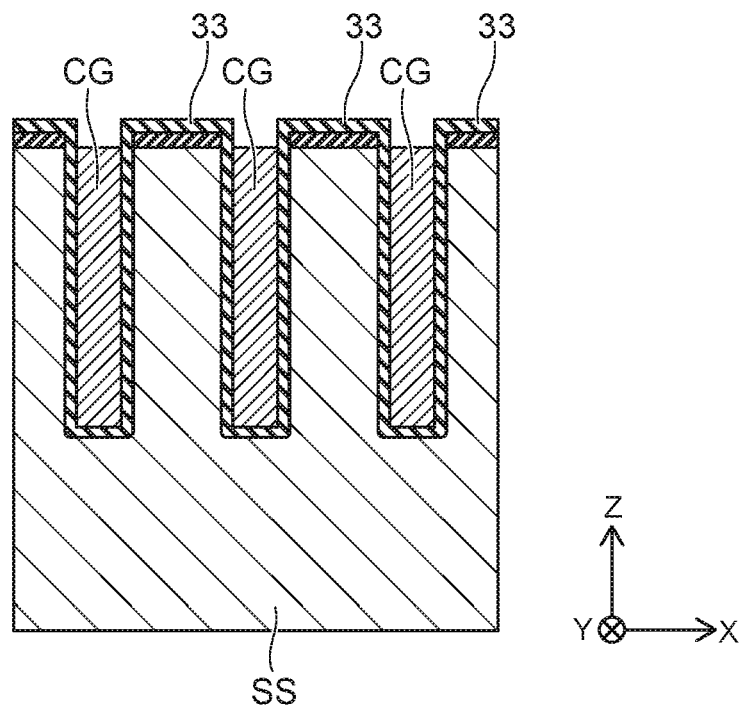

As shown in FIGS. 11A and 11B, the second gate electrodes CG are formed in the interiors of the sub-trenches ST. For example, the second gate electrodes CG are formed by forming a conductive polysilicon layer to fill the interiors of the sub-trenches ST and cover the upper surface of the semiconductor substrate SS, and by subsequently performing etch-back of the polysilicon layer to cause the portion filled into the interiors of the sub-trenches ST to remain. For example, the second gate electrodes CG may be formed by filling the interiors of the sub-trenches ST with a conductive layer including a material different from the first gate electrodes MG.

A portion of the insulating film 33 positioned between the semiconductor substrate SS and the second gate electrodes CG is used to form the gate insulating film 25. Also, another portion positioned between the first gate electrode MG and the second gate electrode CG is used to form the insulating film 27 and electrically insulates the first gate electrode MG and the second gate electrode CG.

Figure 12A:
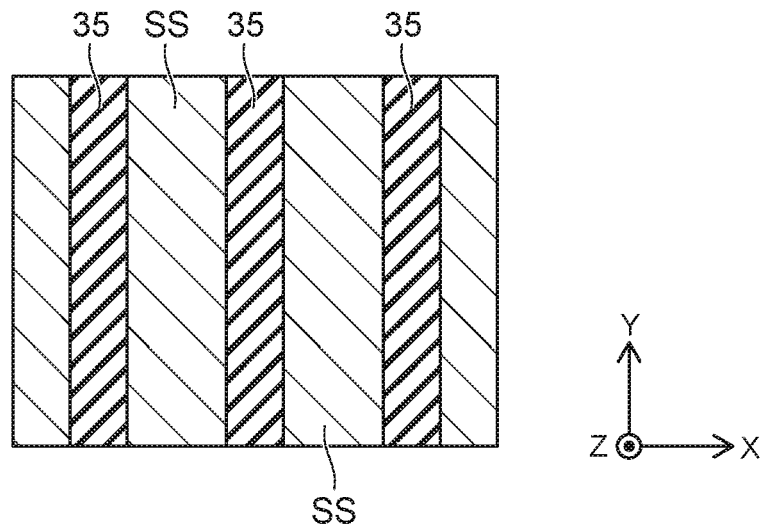
Figure 12B:
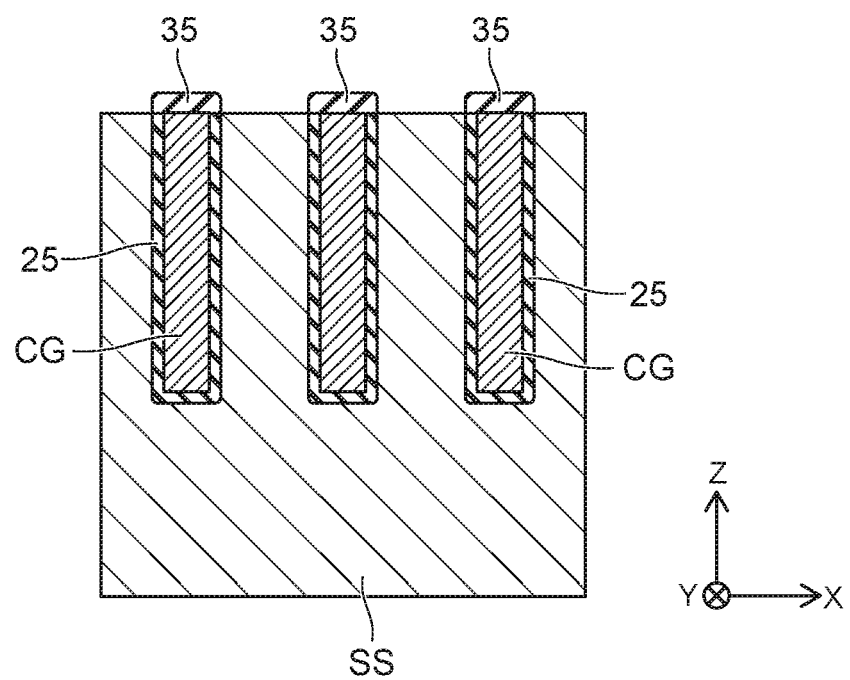

As shown in FIGS. 12A and 12B, an insulating film 35 that covers the upper surfaces of the first gate electrodes MG and the upper surfaces of the second gate electrodes CG is formed; subsequently, the upper surface of the semiconductor substrate SS is exposed by selectively removing the gate insulating films 23 and 35.

Figure 13A:
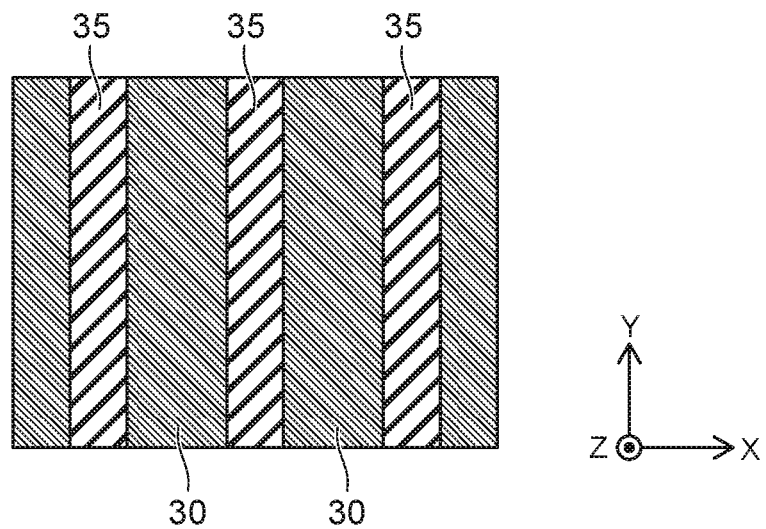
Figure 13B:
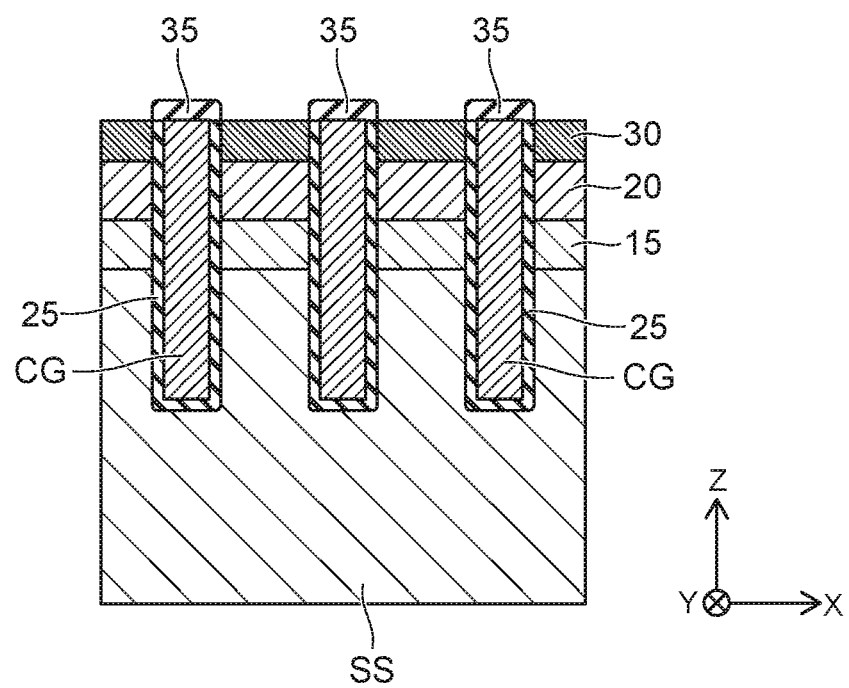

As shown in FIGS. 13A and 13B, the n-type barrier layer 15 and the p-type base layer 20 are formed on the front surface side of the semiconductor substrate SS. For example, the n-type barrier layer 15 and the p-type base layer 20 are formed by ion implantation of an n-type impurity and a p-type impurity via the front surface of the semiconductor substrate SS.

Further, the n-type emitter layer 30 and the p$^+$-type contact layer 40 are formed selectively on the p-type base layer 20. For example, the n-type emitter layer 30 and the p$^+$-type contact layer 40 are formed by ion implantation of an n-type impurity and a p-type impurity. Here, any or all of the n-type barrier layer 15, the p-type base layer 20, the n-type emitter layer 30, and the p$^+$-type contact layer 40 may be formed before the first gate electrode MG and the second gate electrode CG.

Continuing, the gate interconnects 81 and 91 that are connected to the first gate electrode MG and the second gate electrode CG are formed (referring to FIGS. 3C and 3D). Continuing, the emitter electrode 60 that contacts the n-type emitter layer 30 and the p$^+$-type contact layer 40 is formed. Further, the semiconductor substrate SS is thinned to the prescribed thickness by polishing or grinding the backside of the semiconductor substrate SS; subsequently, the n-type buffer layer 17 and the p-type collector layer 70 are formed by ion implantation. A portion of the semiconductor substrate SS is used to form the n$^-$-type base layer 10.

Figure 14:
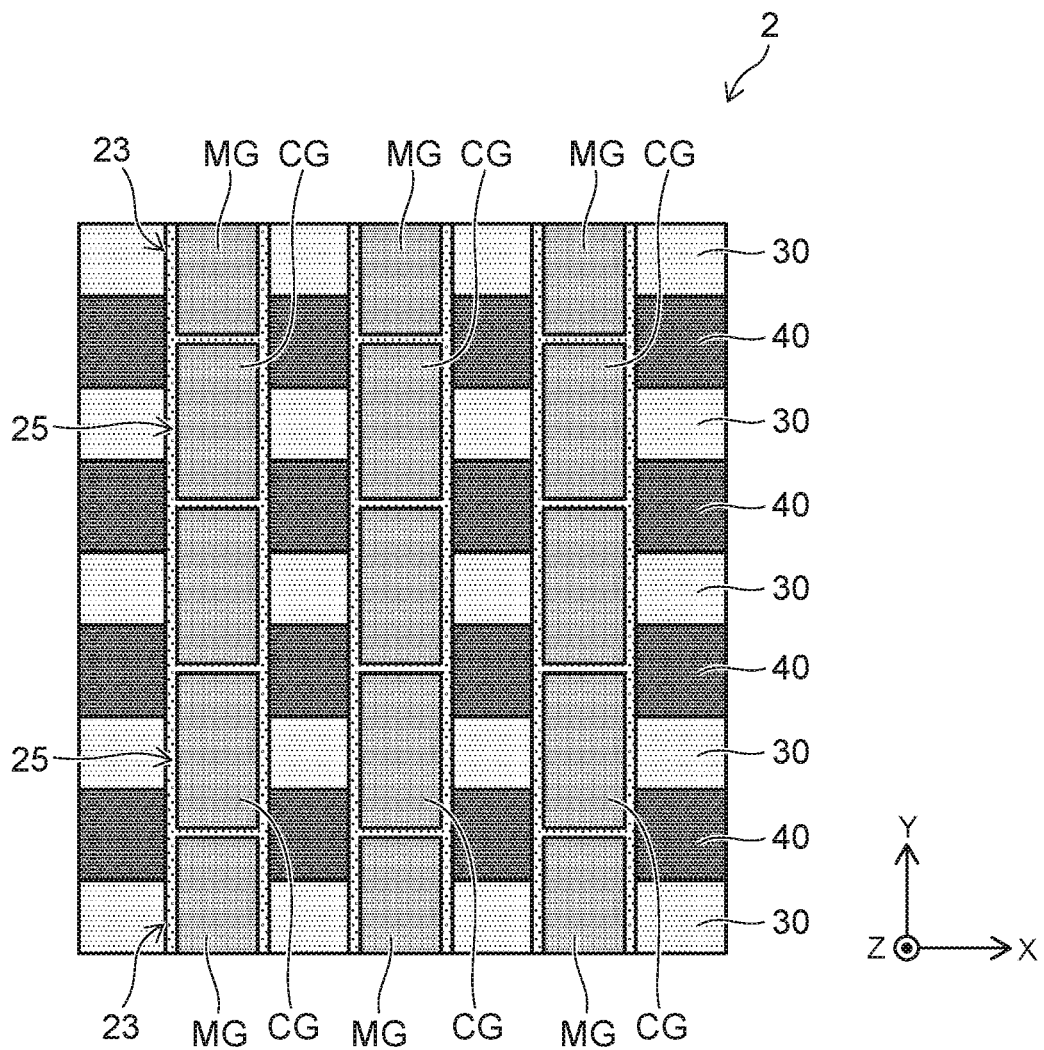
FIG. 14 is a schematic plan view illustrating a semiconductor device according to a modification of the embodiment.

FIG. 14 is a plan view schematically showing a semiconductor device 2 according to a modification of the embodiment. FIG. 14 is a plan view showing the arrangement of the n-type emitter layer 30, the p$^+$-type contact layer 40, the first gate electrode MG, and the second gate electrode CG.

In the example as well, the gate trenches GT that include the first gate electrode MG and the second gate electrode CG are arranged in the X-direction. The n-type emitter layer 30 and the p$^+$-type contact layer 40 are provided between the mutually-adjacent gate trenches GT and are arranged alternately in, for example, the Y-direction.

The first gate electrode MG and the second gate electrode CG are arranged alternately in the Y-direction. Also, the first gate electrode MG and the second gate electrode CG are disposed to oppose both the n-type emitter layer 30 and the p$^+$-type contact layer 40 with the gate insulating films 23 and 25 respectively interposed.

At turn-on in the semiconductor device 2, n-channels are formed in the portions of the p-type base layer 20 respectively opposing the first gate electrode MG and the second gate electrode CG; and electrons are injected from the n-type emitter layer 30 into the n$^-$-type base layer 10 via the n-type barrier layer 15.

Then, before the semiconductor device 2 is turned off, the gate voltage of the second gate electrode CG is lowered to be a threshold or less. Thereby, the n-channel of the portion of the p-type base layer 20 opposing the second gate electrode CG disappears; and the electron injection into the n$^-$-type base layer 10 is suppressed. The n-type accumulation layer of the portion of the n$^-$-type base layer 10 opposing the second gate electrode CG also disappears. Accordingly, the hole injection from the p-type collector layer 70 into the n$^-$-type base layer 10 decreases; and the carrier amount inside the n$^-$-type base layer 10 decreases. Subsequently, the gate voltage of the first gate electrode MG is lowered to be the threshold or less; and the turn-off operation starts.

Thus, by lowering the gate voltage of the second gate electrode CG to be the threshold or less before lowering the gate voltage of the first gate electrode MG to be the threshold or less, the turn-off operation can start from a state in which the carrier amount inside the n$^-$-type base layer 10 is lower than at turn-on. Therefore, the turn-off speed of the semiconductor device 2 can be increased; and the turn-off loss can be reduced.

Further, by supplying a negative potential to the second gate electrode CG, a p-type inversion layer can be caused to occur in the n$^-$-type base layer 10 opposing the second gate electrode CG; and the hole discharge to the emitter electrode can be accelerated.

In the example as well, the lengths in the Y-direction of the n-type emitter layer 30 and the p$^+$-type contact layer 40 can be changed to change the proportions contacting the emitter electrode 60. Accordingly, the ON-resistance and the switching speed of the semiconductor device 2 can be favorably controlled by changing the lengths in the Y-direction of the first gate electrode MG and the second gate electrode CG.

Figure 15:
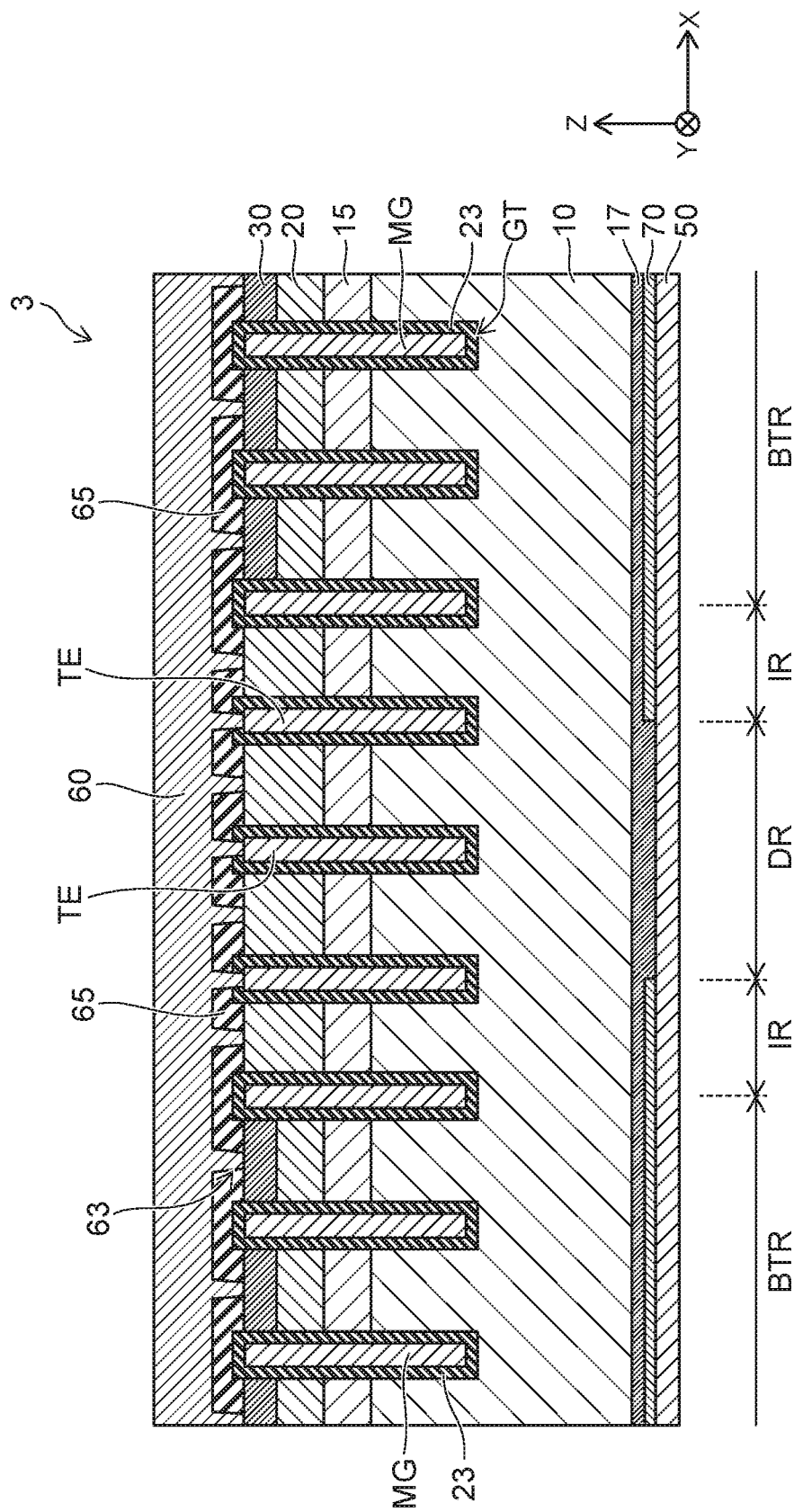
FIG. 15 is a schematic cross-sectional view illustrating a semiconductor device according to another modification of the embodiment.

FIG. 15 is a cross-sectional view schematically showing a semiconductor device 3 according to another modification of the embodiment. The semiconductor device 3 is, for example, an IGBT having a built-in diode and includes a bipolar transistor region BTR and a diode region DR.

The semiconductor device 3 includes the n$^-$-type base layer 10, the n-type barrier layer 15, and the p-type base layer 20. The n$^-$-type base layer 10, the n-type barrier layer 15, and the p-type base layer 20 are provided commonly for the bipolar transistor region BTR and the diode region DR.

The n-type emitter layer 30 and the p-type collector layer 70 are disposed in the bipolar transistor region BTR. The first gate electrode MG and the second gate electrode CG are arranged alternately inside the gate trench GT of the bipolar transistor region BTR.

For example, a trench electrode TE that is connected to the emitter electrode 60 is disposed inside the gate trench GT in the diode region DR. The n-type emitter layer 30 is not provided in the diode region DR. Also, in the diode region DR, the p-type collector layer 70 is not provided; and, for example, the n-type buffer layer 17 is connected to the collector electrode 50.

Between the bipolar transistor region BTR and the diode region DR, the n-type emitter layer 30 is not provided; and a boundary region IR is disposed in which the p-type collector layer 70 is provided.

In the example as well, because the first gate electrode MG and the second gate electrode CG are disposed in the bipolar transistor region BTR, the switching speed can be increased without increasing the ON-resistance.

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modifications as would fall within the scope and spirit of the invention.

What is claimed is:
1. A semiconductor device, comprising:
   a semiconductor body including
      a first semiconductor layer of a first conductivity type,
      a second semiconductor layer provided on the first semiconductor layer, the second semiconductor layer being of a second conductivity type, a third semiconductor layer provided selectively on the second semiconductor layer, the third semiconductor layer being of the first conductivity type, and a fourth semiconductor layer provided selectively on the second semiconductor layer, the fourth semiconductor layer being of the second conductivity type and being arranged with the third semiconductor layer on the second semiconductor layer;

a first control electrode provided inside the semiconductor body, the first control electrode opposing the second semiconductor layer with a first insulating film interposed, the first control electrode including a lower end positioned inside the first semiconductor layer; and a second control electrode provided inside the semiconductor body, the second control electrode opposing the second semiconductor layer with a second insulating film interposed, the second control electrode including a lower end positioned inside the first semiconductor layer, the first control electrode and the second control electrode being provided in a first direction crossing a second direction, the second direction being from the first control electrode toward the second control electrode, a third insulating layer being provided between the first control electrode and the second control electrode, the third insulating layer having a first surface and a second surface opposite to the first surface, the first control electrode contacting the third insulating layer at the first surface, the second control electrode contacting the third insulating layer at the second surface.

2. The device according to claim 1, wherein the third semiconductor layer and the fourth semiconductor layer are arranged alternately in the first direction.

3. The device according to claim 2, wherein
the first control electrode is disposed to oppose the third semiconductor layer with the first insulating film interposed, and
the second control electrode is disposed to oppose the fourth semiconductor layer with the second insulating film interposed.

4. The device according to claim 1, wherein
the third semiconductor layer includes a first-conductivity-type impurity having a higher concentration than a first-conductivity-type impurity of the first semiconductor layer, and
the fourth semiconductor layer includes a second-conductivity-type impurity having a higher concentration than a second-conductivity-type impurity of the second semiconductor layer.

5. The device according to claim 1, further comprising a first electrode and a second electrode electrically connected to the semiconductor body,
the semiconductor body being positioned between the first electrode and the second electrode,
the second electrode contacting the third semiconductor layer and the fourth semiconductor layer and being electrically connected to the third semiconductor layer and the fourth semiconductor layer.

6. The device according to claim 5, further comprising an inter-layer insulating film provided between the semiconductor body and the second electrode,
the second electrode being electrically connected to the third semiconductor layer and the fourth semiconductor layer via a contact hole provided in the inter-layer insulating film.

7. The device according to claim 5, wherein
the semiconductor body further includes a fifth semiconductor layer and a sixth semiconductor layer
the fifth semiconductor layer contacting the first electrode and being electrically connected to the first electrode, the fifth semiconductor layer being positioned between the first electrode and the first semiconductor layer, the fifth semiconductor layer being of the second conductivity type,
the sixth semiconductor layer being provided between the first semiconductor layer and the fifth semiconductor layer, the sixth semiconductor layer being of the first conductivity type, the sixth semiconductor layer including a first-conductivity-type impurity with a higher concentration than a concentration of a first-conductivity-type impurity in the first semiconductor layer; and
a layer thickness of the fifth semiconductor layer in the second direction is thinner than a layer thickness of the sixth semiconductor layer in the second direction.

8. The device according to claim 1, wherein
the semiconductor body further includes a seventh semiconductor layer provided between the first semiconductor layer and the second semiconductor layer, the seventh semiconductor layer being of the first conductivity type, and
the seventh semiconductor layer includes a first-conductivity-type impurity having a higher concentration than a first-conductivity-type impurity of the first semiconductor layer.

9. The device according to claim 1, wherein the first control electrode includes a material different from a material of the second control electrode.

10. The device according to claim 1, wherein
the first control electrode is disposed to oppose the third semiconductor layer with the first insulating film interposed, and
the second control electrode is disposed to oppose the fourth semiconductor layer with the second insulating film interposed.

11. The device according to claim 1, wherein
the third semiconductor layer and the fourth semiconductor layer are provided respectively in a plurality, the third semiconductor layer and the fourth semiconductor layer being arranged alternately in the first direction, the plurality of third semiconductor layers including one third semiconductor layer and one other third semiconductor layer, the plurality of fourth semiconductor layers including one fourth semiconductor layer positioned between the one third semiconductor layer and the one other third semiconductor layer; and
the first control electrode and the second control electrode are disposed with respect to the one third semiconductor layer, the one other semiconductor layer and the one fourth semiconductor layer such that the first control electrode is disposed to oppose the one third semiconductor and a portion of the one fourth semiconductor layer with the first insulating film interposed, and the second control electrode is disposed to oppose the one other third semiconductor layer and the remaining portion of the one fourth semiconductor layer with the second insulating layer interposed.

12. The device according to claim 1, wherein
the third semiconductor layer and the fourth semiconductor layer are provided respectively in a plurality, the third semiconductor layer and the fourth semiconductor layer being arranged alternately in the first direction;

the first control electrode is disposed to oppose one of the third semiconductor layers and a portion of the fourth semiconductor layer with the first insulating film interposed.

13. The device according to claim 1, wherein the third semiconductor layer and the fourth semiconductor layer are provided respectively in a plurality, the third semiconductor layer and the fourth semiconductor layer being arranged alternately in the first direction;

the second control electrode is disposed to oppose one of the fourth semiconductor layers and a portion of the third semiconductor layer with the second insulating film interposed.

14. The device according to claim 1, further comprising:

a third control electrode provided in the semiconductor body, the third control electrode being opposed to the second semiconductor layer via a fourth insulating layer and having an end positioned in the first semiconductor layer, the third control electrode being disposed at a position spaced from the first control electrode and the second control electrode.

15. The device according to claim 14, wherein the semiconductor body further includes a fifth semiconductor layer of the second conductivity type and a sixth semiconductor layer, the fifth semiconductor layer being selectively provided between the first electrode and the first semiconductor layer, the sixth semiconductor layer being provided between the first electrode and the first semiconductor layer and including a first conductivity type impurity having a higher concentration than a concentration of a first conductivity type impurity in the first semiconductor layer, the fifth semiconductor layer is provided between the sixth semiconductor layer and the first electrode, and is positioned between the third semiconductor layer and the first electrode, and the fifth semiconductor layer is not provided between the third control electrode and the first electrode.

16. The device according to claim 1, wherein the first control electrode is electrically insulated from the second control electrode.

17. The device according to claim 1, wherein the first control electrode and the second control electrode are electrically configured such that first gate bias is applied to the first control electrode and second gate bias is applied to the second control electrode when the semiconductor device is turned on, and the first gate bias is lowered under the prescribed threshold bias at the first control electrode after the prescribed time has passed from the timing of lowering the second gate bias under the prescribed threshold bias at the second control electrode when the semiconductor device is turned off.

18. The device according to claim 1, wherein a plurality of the first control electrodes and a plurality of the second control electrodes are provided inside the semiconductor body, the first control electrodes and the second control electrodes being arranged alternately in the first direction; and the first control electrodes includes another first control electrode, the second control electrode being provided between the first control electrode and said another first control electrode, another third insulating film being provided between the second control electrode and said another first control electrode, the second control electrode and said another first control electrode contacting said another third insulating film.

* * * * *